(12) United States Patent  
Lin et al.

(10) Patent No.: US 10,424,563 B2  
(45) Date of Patent: Sep. 24, 2019

(54) SEMICONDUCTOR PACKAGE ASSEMBLY AND METHOD FOR FORMING THE SAME

(71) Applicant: MediaTek Inc., Hsin-Chu (TW)

(72) Inventors: Tzu-Hung Lin, Zhubei (TW); I-Hsuan Peng, Hsinchu (TW); Ching-Wen Hsiao, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/066,241

(22) Filed: Mar. 10, 2016

(65) Prior Publication Data

US 2016/0343694 A1 Nov. 24, 2016

Related U.S. Application Data

(60) Provisional application No. 62/163,470, filed on May 19, 2015.

(51) Int. Cl.
*H01L 25/16* (2006.01)
*H01L 23/538* (2006.01)
(Continued)

(52) U.S. Cl.
CPC ............ *H01L 25/16* (2013.01); *H01L 21/568* (2013.01); *H01L 21/78* (2013.01); *H01L 23/49811* (2013.01); *H01L 23/5383* (2013.01); *H01L 23/5384* (2013.01); *H01L 23/5389* (2013.01); *H01L 24/19* (2013.01); *H01L 24/20* (2013.01); *H01L 24/94* (2013.01); *H01L 24/97* (2013.01); *H01L 25/105* (2013.01); *H01L 25/50* (2013.01); *H01L 24/13* (2013.01); *H01L 24/16* (2013.01); *H01L 24/32* (2013.01); *H01L 24/73* (2013.01); *H01L 24/81* (2013.01); *H01L*

*24/92* (2013.01); *H01L 2224/0401* (2013.01); *H01L 2224/04042* (2013.01); *H01L 2224/04105* (2013.01); *H01L 2224/12105* (2013.01); *H01L 2224/131* (2013.01); *H01L 2224/13147* (2013.01);

(Continued)

(58) Field of Classification Search
CPC ...... H01L 2225/1041; H01L 2225/1058; H01L 2924/19011; H01L 2924/19041; H01L 2924/19042; H01L 2924/19043; H01L 2924/19104; H01L 2224/32145; H01L 21/568

See application file for complete search history.

(56) References Cited

U.S. PATENT DOCUMENTS 9,269,595 B2 2/2016 Chi et al.
2008/0023824 A1* 1/2008 Salzman ............... H01L 23/481
257/724

(Continued)

FOREIGN PATENT DOCUMENTS

TW 201140792 11/2011

*Primary Examiner* — Frederick B Hargrove
(74) *Attorney, Agent, or Firm* — Wolf, Greenfield & Sacks, P.C.

(57) ABSTRACT

A semiconductor package assembly is provided. The semiconductor package assembly includes a semiconductor package. The semiconductor package includes a semiconductor die. A redistribution layer (RDL) structure is disposed on the semiconductor die and is electrically connected to the semiconductor die. An active or passive element is disposed between the semiconductor die and the RDL structure. A molding compound surrounds the semiconductor die and the active or passive element.

29 Claims, 8 Drawing Sheets

(51) Int. Cl.
*H01L 25/00* (2006.01)
*H01L 21/56* (2006.01)
*H01L 21/78* (2006.01)
*H01L 23/00* (2006.01)
*H01L 25/10* (2006.01)
*H01L 23/498* (2006.01)

(52) U.S. Cl.
CPC ............... *H01L 2224/1403* (2013.01); *H01L 2224/14051* (2013.01); *H01L 2224/16145* (2013.01); *H01L 2224/16265* (2013.01); *H01L 2224/32145* (2013.01); *H01L 2224/32225* (2013.01); *H01L 2224/48091* (2013.01); *H01L 2224/48227* (2013.01); *H01L 2224/73209* (2013.01); *H01L 2224/73253* (2013.01); *H01L 2224/73265* (2013.01); *H01L 2224/73267* (2013.01); *H01L 2224/81815* (2013.01); *H01L 2224/92124* (2013.01); *H01L 2224/92225* (2013.01); *H01L 2224/92244* (2013.01); *H01L 2224/94* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/1431* (2013.01); *H01L 2924/1432* (2013.01); *H01L 2924/1434* (2013.01); *H01L 2924/1436* (2013.01); *H01L 2924/15311* (2013.01); *H01L 2924/19011* (2013.01); *H01L 2924/19041* (2013.01); *H01L 2924/19042* (2013.01); *H01L 2924/19043* (2013.01); *H01L 2924/19104* (2013.01); *H01L 2924/37001* (2013.01)

(56) References Cited

U.S. PATENT DOCUMENTS

| | | | |
|---|---|---|---|
| 2010/0123215 A1* | 5/2010 | Pan | H01L 23/49816 257/532 |
| 2011/0186977 A1 | 8/2011 | Chi et al. | |
| 2011/0285007 A1* | 11/2011 | Chi | H01L 24/96 257/686 |
| 2012/0032340 A1* | 2/2012 | Choi | H01L 21/561 257/774 |
| 2012/0049344 A1 | 3/2012 | Pagaila et al. | |
| 2013/0099378 A1 | 4/2013 | Cho et al. | |
| 2013/0343022 A1* | 12/2013 | Hu | H01L 25/16 361/761 |
| 2014/0077361 A1* | 3/2014 | Lin | H01L 22/14 257/737 |
| 2015/0179616 A1* | 6/2015 | Lin | H01L 25/50 257/773 |
| 2015/0287700 A1* | 10/2015 | Yu | H01L 23/5386 257/774 |
| 2015/0380392 A1* | 12/2015 | Pang | H01L 21/56 257/777 |
| 2016/0049385 A1 | 2/2016 | Yu et al. | |
| 2016/0056100 A1* | 2/2016 | Yeh | H01L 24/81 257/676 |
| 2016/0322337 A1* | 11/2016 | Liang | H01L 25/105 |

* cited by examiner

SEMICONDUCTOR PACKAGE ASSEMBLY AND METHOD FOR FORMING THE SAME

CROSS REFERENCE TO RELATED APPLICATIONS

This Application is based on, and claims the benefit of U.S. Provisional Application No. 62/163,470 filed on May 19, 2015, the entirety of which is incorporated by reference herein.

BACKGROUND OF THE INVENTION

Field of the Invention

The present invention relates to a semiconductor package assembly, and in particular to a semiconductor package assembly with a passive device and methods for forming the same.

Description of the Related Art

In order to ensure miniaturization and multi-functionality of electronic products and communication devices, it is desired that semiconductor packages be small in size, support multi-pin connection, operate at high speeds, and provide high functionality. A conventional semiconductor package usually places passive devices on a printed circuit board (PCB). However, the PCB is required to provide additional area for the passive devices mounted thereon. It is hard to reduce the package size.

Thus, a novel semiconductor package assembly and methods for forming the same are desirable.

BRIEF SUMMARY OF THE INVENTION

A semiconductor package assembly and a method for forming a semiconductor package assembly are provided.

An exemplary embodiment of a semiconductor package assembly includes a semiconductor package. The semiconductor package includes a semiconductor die. A redistribution layer (RDL) structure is disposed on the semiconductor die and is electrically connected to the semiconductor die. An active or passive element is disposed between the semiconductor die and the RDL structure. A molding compound surrounds the semiconductor die and the active or passive element.

Another exemplary embodiment of a semiconductor package assembly includes a first semiconductor package. The first semiconductor package includes a semiconductor die. A redistribution layer (RDL) structure is disposed on the semiconductor die and is electrically connected to the semiconductor die. An active or passive element is disposed between the semiconductor die and the RDL structure. The semiconductor package assembly also includes a second semiconductor package stacked on the first semiconductor package. The first semiconductor die is positioned between the active or passive element and the second semiconductor package.

An exemplary embodiment of a method for forming a semiconductor package assembly includes forming a semiconductor package. The formation of the semiconductor package includes providing an active or passive element on a semiconductor die. A molding compound is formed and surrounds the semiconductor die and the active or passive element. An RDL structure is formed on the semiconductor die and is electrically connected to the semiconductor die. The active or passive element is positioned between the semiconductor die and the RDL structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIGS. 1A-1D are cross-sectional views of various stages of a method for forming a semiconductor package assembly, in accordance with some embodiments of the disclosure. Additional operations can be provided before, during, and/or after the stages described in FIGS. 1A-1D. Some of the stages that are described can be replaced or eliminated for different embodiments. Additional features can be added to the semiconductor package assembly. Some of the features described below can be replaced or eliminated for different embodiments.

Figure 1A:
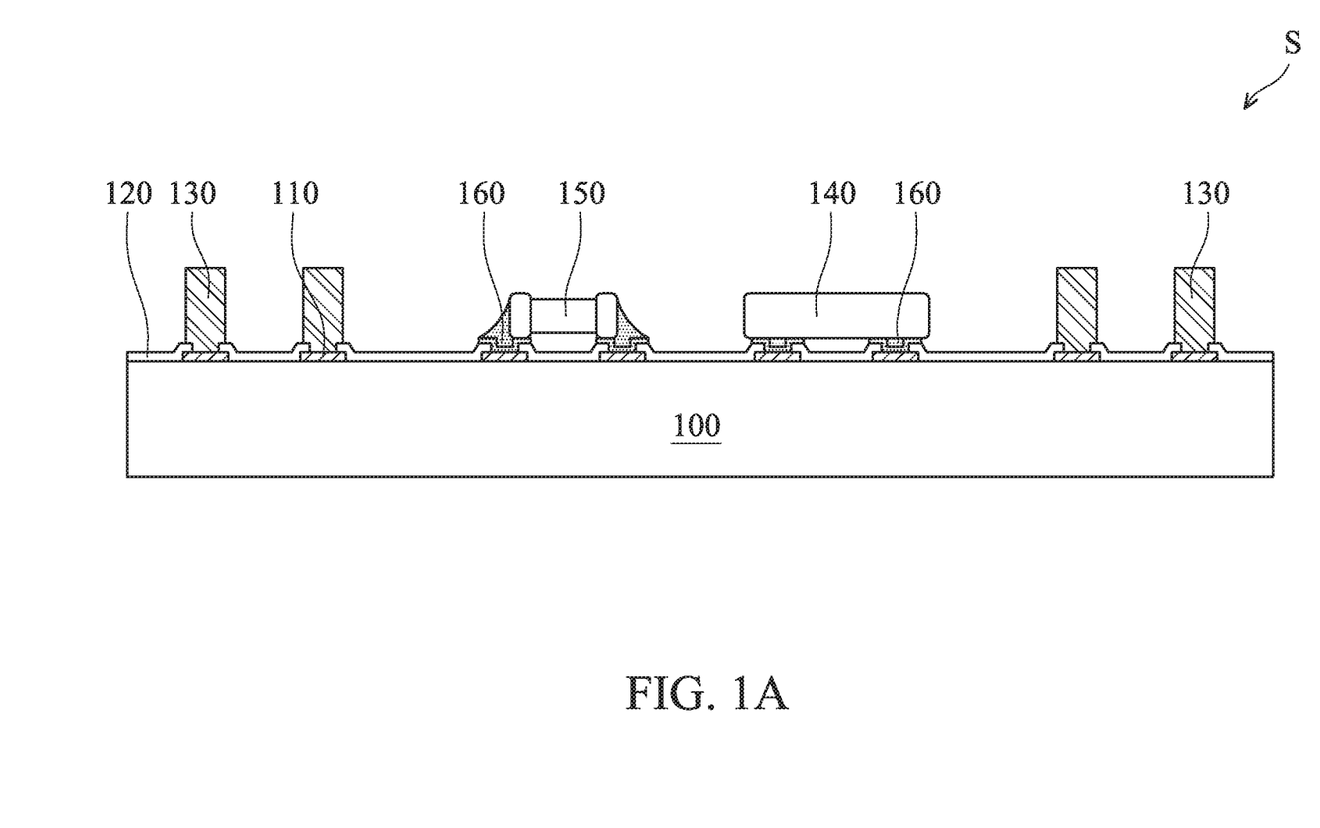
FIGS. 1A-1E are cross-sectional views of various stages of a method for forming a semiconductor package assembly, in accordance with some embodiments of the disclosure.

As shown in FIG. 1A, a semiconductor die (chip) 100 is provided. In some embodiments, the semiconductor die 100 is an application processor (AP) die. In some other embodiments, the semiconductor die 100 may be a logic die or another suitable die. For example, the logic die may include a central processing unit (CPU), a graphics processing unit (GPU), a dynamic random access memory (DRAM) controller, or a combination thereof.

Pads 110 of the semiconductor die 100 are disposed on the front surface of the semiconductor die 100. In some embodiments, the pads 110 are portions of the uppermost metal layer in the interconnection structure of the semiconductor die 100. A passivation layer 120 is disposed on the front surface of the semiconductor die 100. The passivation layer 120 partially covers the pads 110.

As shown in FIG. 1A, vias 130 are formed on the semiconductor die 100. The vias 130 are electrically and physically connected to some of the pads 110 exposed from the passivation layer 120. The vias 130 may be through interposer vias (TIV). In some embodiments, the vias 130 include copper, another suitable conductive material, or a combination thereof. In some embodiments, the vias 130 are formed by an electroplating process or another suitable process.

As shown in FIG. 1A, an active element 140 and a passive element 150 are provided on the semiconductor die 100. The active element 140 and the passive element 150 are bonded to some of the pads 110 exposed from the passivation layer 120. In some embodiments, the active element 140 is a semiconductor die. In some embodiments, the active element 140 and the semiconductor die 100 have different functions. The active element 140 may be a baseband (BB) die or another suitable active element. In some embodiments, the passive element 150 is an integrated passive device (IPD). The passive element 150 may include capacitors, resistors, inductors, varactor diodes, or another suitable passive element.

The active element 140, the passive element 150 and the vias 130 are positioned on the semiconductor die 100 side by side. In some embodiments, the vias 130 surround the active element 140 and the passive element 150 as viewed from a top-view perspective.

In one embodiment, as shown in FIG. 1A, the vias 130 are higher than the active element 140 and the passive element 150. In some embodiments, the top surface of the vias 130 is substantially aligned to the top surface of the active element 140. In some other embodiments, the vias 130 are lower than the active element 140. In some embodiments, the vias 130 are not lower than the passive element 150.

In one embodiment, as shown in FIG. 1A, one active element 140 and one passive element 150 are bonded to the semiconductor die 100. Many variations and/or modifications can be made to embodiments of the disclosure. In another embodiment, more than one active element 140 with the same or different functions is bonded to the semiconductor die 100. In yet another embodiment, more than one passive element 150 with the same or different functions is bonded to the semiconductor die 100. In some embodiments, only one of the active element 140 and the passive element 150 is bonded to the semiconductor die 100. In some other embodiments, only active elements 140 or passive elements 150 are bonded to the semiconductor die 100.

In some embodiments, the active element 140 and the passive element 150 are electrically and physically connected to some of the pads 110 through conductive structures 160. Each of the conductive structures 160 may include one or more conductive layers, a conductive bump, a conductive pillar, conductive paste/glue, or another conductive structure. In some embodiments, the conductive structures 160 include solder, copper, another suitable conductive material, or a combination thereof.

In some embodiments, the active element 140 and the passive element 150 are bonded to the semiconductor die 100 by the same process (such as a reflow process). In some other embodiments, the active element 140 and the passive element 150 are bonded to the semiconductor die 100 in different steps.

In accordance with some embodiments of the disclosure, the vias 130 are formed on a wafer, and the active element 140 and the passive element 150 are bonded to the wafer with the vias 130 thereon. Afterwards, the wafer is diced to multiple semiconductor dies 100. As a result, multiple subpackages S including the semiconductor die 100, the vias 130, the active element 140 and the passive element 150 are formed by a wafer-level process. In some embodiments, the active element 140 and the passive element 150 are electrically coupled to the semiconductor die 100 without external conductive components which are disposed outside of the subpackage S.

Figure 1B:
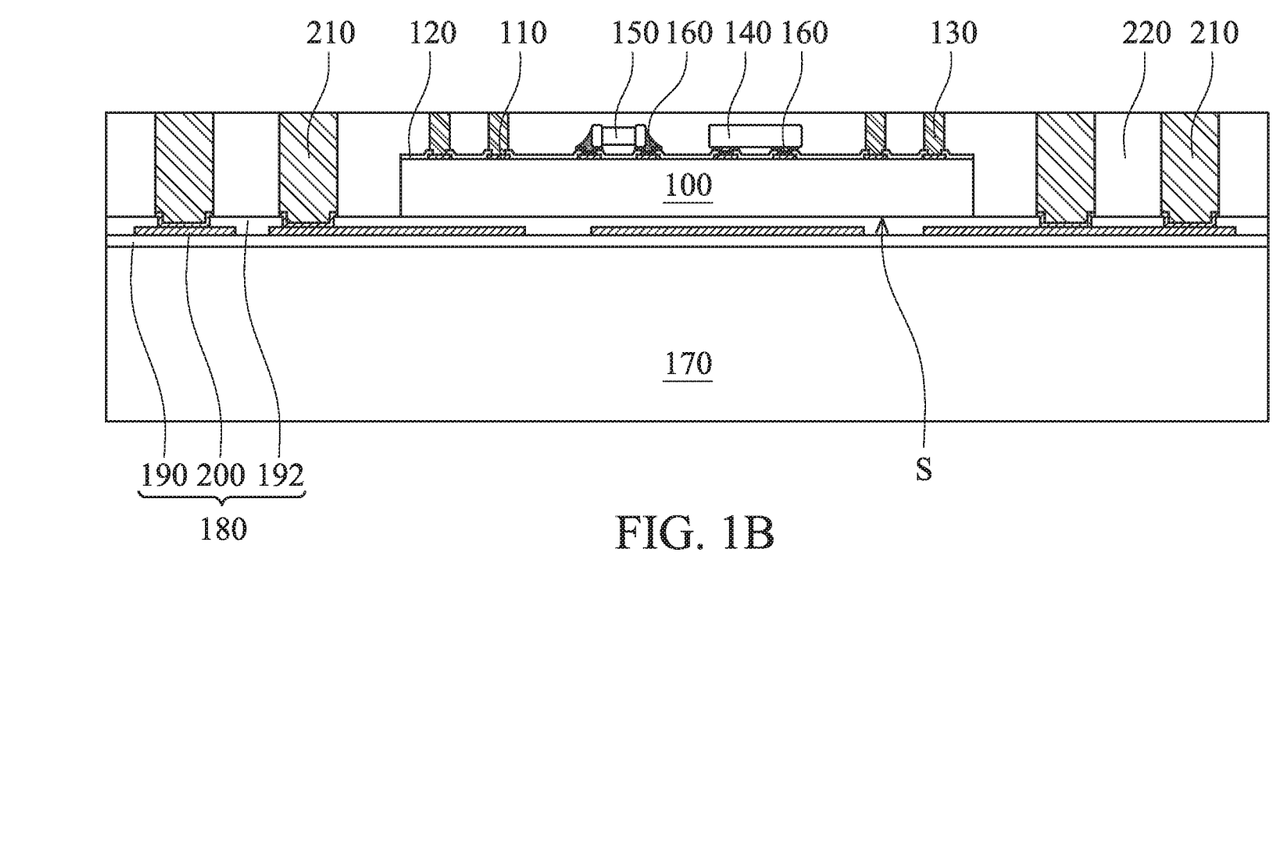

As shown in FIG. 1B, a carrier substrate 170 is provided. In some embodiments, the carrier substrate 170 is a wafer or a panel. The carrier substrate 170 may include glass or another suitable supporting material.

As shown in FIG. 1B, a redistribution layer (RDL) structure 180 is formed on the carrier substrate 170. The RDL structure 180 may include one or more conductive traces disposed in an inter-metal dielectric (IMD) layer. For example, a plurality of conductive traces 200 is disposed at a first layer-level of an IMD layer. The conductive traces 200 are positioned on a first sub-dielectric layer 190 of the IMD layer and covered by a second sub-dielectric layer 192 of the IMD layer. The RDL structure 180 may further include a plurality of conductive traces (not shown) disposed at another layer-level of the IMD layer.

In some embodiments, the first sub-dielectric layer 190 and the second sub-dielectric layer 192 of the IMD layer may be formed of organic materials, which include a polymer base material, non-organic materials, which include silicon nitride ($SiN_x$), silicon oxide ($SiO_x$), graphene, or the like. For example, the first and second sub-dielectric layers 190 and 192 are made of a polymer base material, in which the first sub-dielectric layer 190 has a thickness of about 12 μm and the second sub-dielectric layer 192 has a thickness of about 24 μm.

Pad portions of the conductive traces 200 are exposed from the top of the RDL structure 180. For example, the pad portions of the conductive traces 200 are exposed from openings of the second sub-dielectric layer 192 and connected to subsequently formed conductive components. It should be noted that the numbers and the arrangements of the conductive traces and the sub-dielectric layers of the RDL structure 180 shown in the figures are only an example and are not a limitation to the present invention. The RDL structure 180 is optional. In some other embodiments, the RDL structure 180 is not formed.

As shown in FIG. 1B, vias 210 are formed on the RDL structure 180. The vias 210 are electrically and physically connected to the pad portions of the conductive traces 200. The vias 210 may be through package vias (TPVs). In some embodiments, the vias 210 include copper, another suitable conductive material, or a combination thereof. In some embodiments, the vias 210 are formed by an electroplating process or another suitable process. In some embodiments, the size and the height of the vias 210 are greater than that of the vias 130.

Afterwards, the subpackage S including the semiconductor die 100, the vias 130, the active element 140 and the passive element 150 is provided on the carrier substrate 170. The subpackage S and the vias 210 are positioned on the carrier substrate 170 side by side. In some embodiments, the vias 210 surround the semiconductor die 100 and the vias 130 as viewed from a top-view perspective.

In some embodiments, the subpackage S is attached to the RDL structure 180 through an adhesive layer such as glue or another suitable adhesive material. The RDL structure 180 is positioned between the semiconductor die 100 and the carrier substrate 170. In some embodiments, the semiconductor die 100 is positioned between the active element 140 and the RDL structure 180, and is positioned between the passive element 150 and the RDL structure 180.

As shown in FIG. 1B, a molding compound 220 is formed on the carrier substrate 170. The molding compound 220 surrounds the semiconductor die 100, the vias 130, the active element 140, the passive element 150 and the vias 210. In some embodiments, the molding compound 220 covers the semiconductor die 100, the active element 140, the passive element 150 and the RDL structure 180.

In some embodiments, the molding compound 220 is formed of a nonconductive material such as an epoxy, a resin, a moldable polymer, or another suitable molding material. In some embodiments, the molding compound 220 is applied as a substantial liquid, and then is cured through a chemical reaction. In some other embodiments, the molding compound 220 is an ultraviolet (UV) or thermally cured polymer applied as a gel or malleable solid, and then is cured through a UV or thermal curing process. The molding compound 220 may be cured with a mold.

In some embodiments, the deposited molding compound 220 covers the top surfaces of the vias 130 and 210, and then a grinding process is performed to thin the deposited molding compound 220. As a result, the thinned molding compound 220 exposes the top surfaces of the vias 130 and 210. In some embodiments, the top surfaces of the vias 130 and 210 are coplanar with the top surface of the molding compound 220.

In some cases, the top surfaces of the vias 130 and 210 are oxidized during the processes. In some embodiments, the oxidized top surfaces of the vias 130 and 210 are ground and removed when the deposited molding compound 220 is thinned. Therefore, the reliability of the semiconductor package assembly is improved. The back surface of the active element 140 may be ground when the deposited molding compound 220 is thinned.

Figure 1C:
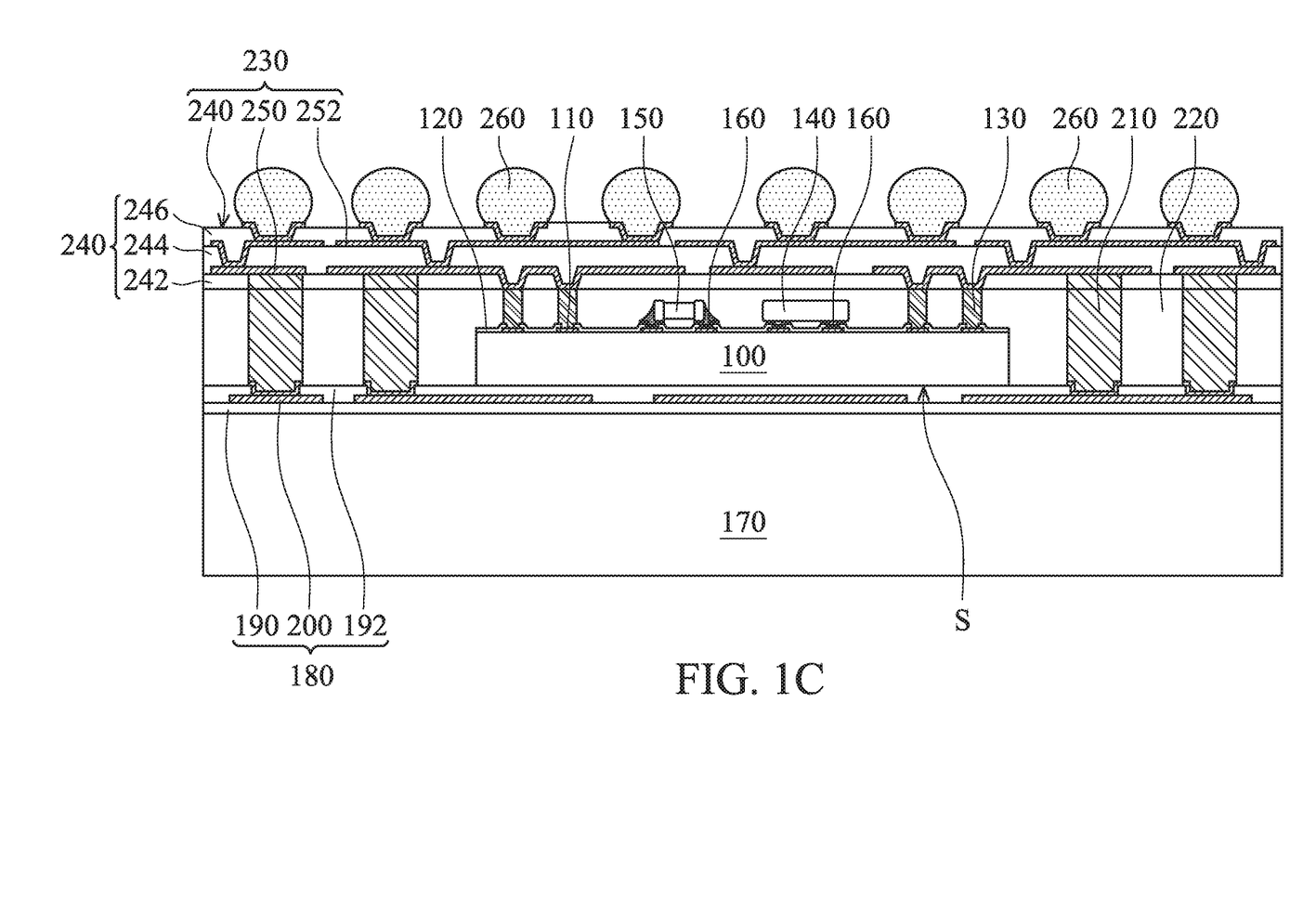

As shown in FIG. 1C, a redistribution layer (RDL) structure 230, which is also referred to as a fan-out structure, is formed on the molding compound 220. In some embodiments, the RDL structure 230 is electrically connected to the semiconductor die 100 through the vias 130. The vias 130 are positioned between the semiconductor die 100 and the RDL structure 230. In some embodiments, the RDL structure 230 is electrically connected to the RDL structure 180 through the vias 210.

In some embodiments, the RDL structure 230 may include one or more conductive traces disposed in an IMD layer. For example, a plurality of first conductive traces 250 is disposed at a first layer-level of an IMD layer 240 and at least one of the plurality of first conductive traces 250 is electrically coupled to the semiconductor die 100. Moreover, a plurality of second conductive traces 252 is disposed at a second layer-level different from the first layer-level of the IMD layer 240. In this case, the IMD layer 240 may include first, second, third sub-dielectric layers 242, 244, and 246 successively stacked on the molding compound 220. The first conductive traces 250 are positioned on the first sub-dielectric layer 242. The second conductive traces 252 are positioned on the second sub-dielectric layer 244 and covered by the third sub-dielectric layer 246. Also, the first conductive traces 250 are separated from the second conductive traces 252 by the second sub-dielectric layer.

In some embodiments, the IMD layer 240 may be formed of organic materials, which include a polymer base material, non-organic materials, which include silicon nitride ($SiN_x$), silicon oxide ($SiO_x$), graphene, or the like. For example, the first, second, third sub-dielectric layers 242, 244, and 246 are made of a polymer base material, in which the first sub-dielectric layer 242 has a thickness of about 12 μm and the second sub-dielectric layer 244 has a thickness of about 24 μm. In some embodiments, the IMD layer 240 is a high-k dielectric layer (k is the dielectric constant of the dielectric layer). In some other embodiments, the IMD layer 240 may be formed of a photosensitive material, which includes a dry film photoresist, or a taping film.

Pad portions of the second conductive traces 252 are exposed from the top of the RDL structure 230. For example, the pad portions of the second conductive traces 252 are exposed from openings of the third sub-dielectric layers 246 and connected to subsequently formed conductive components. It should be noted that the numbers and the arrangements of the conductive traces and the sub-dielectric layers of the RDL structure 230 shown in the figures are only an example and are not a limitation to the present invention.

As shown in FIG. 1C, multiple conductive components 260 are mounted on the RDL structure 230. The conductive components 260 are electrically and physically connected to the pad portions of the second conductive traces 252. In some embodiments, the conductive components 260 and the active element 140 are positioned on two opposite sides of the RDL structure 230. Similarly, the conductive components 260 and the passive element 150 are positioned on the two opposite sides of the RDL structure 230.

In some embodiments, the conductive components 260 are conductive pillars, conductive bumps (such as micro bumps), conductive paste structures, or another suitable conductive component. The conductive components 260 may include copper, solder, or another suitable conductive material.

Figure 1D:
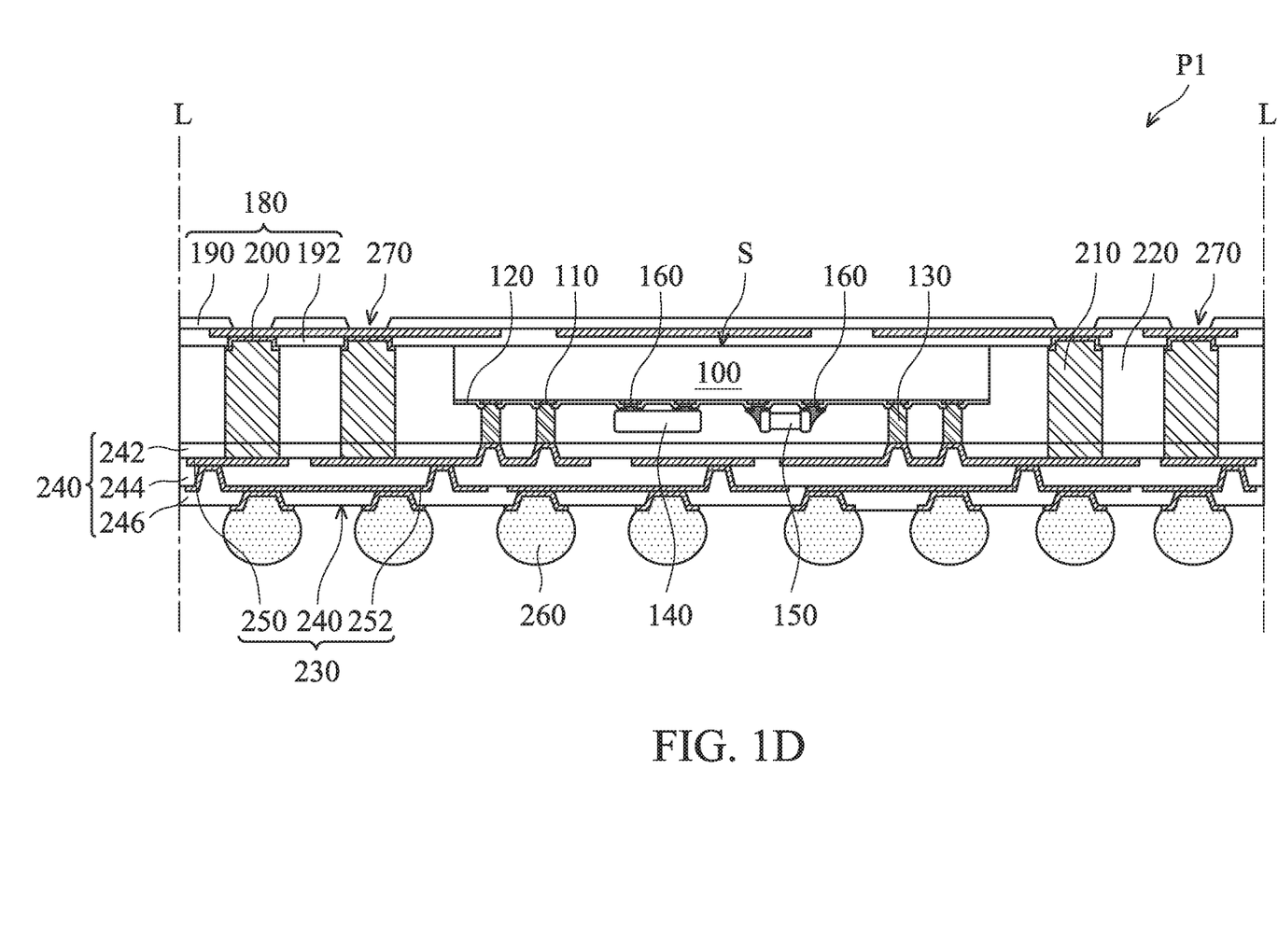

As shown in FIG. 1D, the carrier substrate 170 is debonded. The carrier substrate 170 is removed to expose the RDL structure 180. Next, multiple openings 270 are formed in the RDL structure 180. As a result, the pad portions of the conductive traces 200 are exposed from the bottom of the RDL structure 180. Some conductive components will be formed in the openings 270 to provide electrical conductive paths between the RDL structure 180 and a subsequently bonded semiconductor package (such as a memory package or another suitable semiconductor package). In some embodiments, the openings 270 are formed by a laser drilling process, an etching process (such as a dry etching process) or another applicable process.

Afterwards, the RDL structure 180, the molding compound 220, and the RDL structure 230 are diced along scribe lines L to form multiple semiconductor packages. The diced semiconductor package is then bonded to another semiconductor package (such as a memory package or another suitable semiconductor package) so as to form multiple semiconductor package assemblies P1. In other words, wafer-level fan-out packages are integrated in the semiconductor package assemblies P1.

In some embodiments, the semiconductor package assembly P1 can be further mounted on a base. For example, the base is a printed circuit board (PCB) and may be formed of polypropylene (PP). The conductive components 260 provide electrical conductive paths between the semiconductor package assembly P1 and the base.

In accordance with some embodiments of the disclosure, electrical conductive paths between the semiconductor die 100 and an electronic element mounted on the front surface of the semiconductor die 100 are constructed by the vias 130, the RDL structure 230 and the conductive components 260. Furthermore, electrical conductive paths between the semiconductor die 100 and an electronic element mounted on the back surface of the semiconductor die 100 are constructed through the vias 130, the RDL structure 230 and the vias 210.

As shown in FIG. 1D, each of the semiconductor package assemblies P1 includes the active element 140 and the passive element 150 disposed between the semiconductor die 100 and the RDL structure 230. In other words, the active element 140 and the passive element 150 are vertically stacked on the semiconductor die 100, and are integrated into the semiconductor package. Therefore, the size (in particular to the lateral size) of the semiconductor package assemblies P1 is greatly reduced. Moreover, the trace loops between the active element 140 and the semiconductor die 100 and between the passive element 150 and the semiconductor die 100 become shorter. As a result, the semiconductor package assemblies P1 have a better signal integrity/power integrity (SI/PI) performance, and the resistive-capacitive (RC) delay is mitigated.

In some cases, one or more passive elements and multiple conductive components are positioned side by side on a die. The passive elements and the conductive components are mounted on the die by surface-mount technology (SMT) in different steps. Since the passive elements and the conductive components are mounted on the same plane, some SMT yield issues (such as solder bridges and so on) occur during the formation of the passive elements and the conductive components. Also, it is difficult to perform SMT reworking for the passive elements or the conductive components.

Figure 1E:
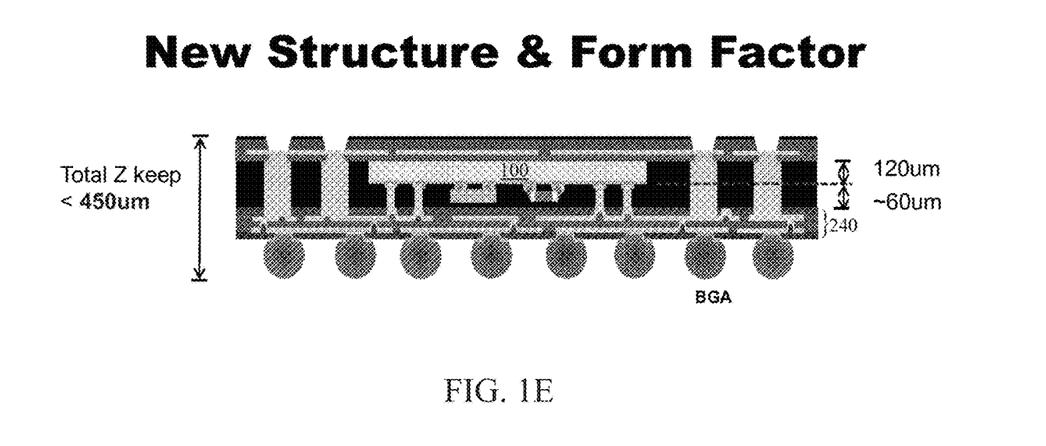

As shown in FIG. 1D, the passive element 150 and the conductive components 260 are vertically stacked. The passive element 150 and the conductive components 260 are positioned on different planes, rather than side by side on the same plane. Consequently, the aforementioned SMT yield issues are eliminated. The SMT reworking also becomes easier to perform. Furthermore, the space on the RDL structure 230 is not occupied by the passive element 150. More conductive components 260 can be mounted on the RDL structure 230. Accordingly, the number of input/output (I/O) connections of the semiconductor package assemblies P1 is increased. Design flexibility for the passive element 150 and the conductive components 260 is further enhanced. FIG. 1E shows structure and form factor of an exemplary semiconductor package assembly where the semiconductor die 100 and RDL structure 240 are separated by no more than 60 μm.

Figure 2:
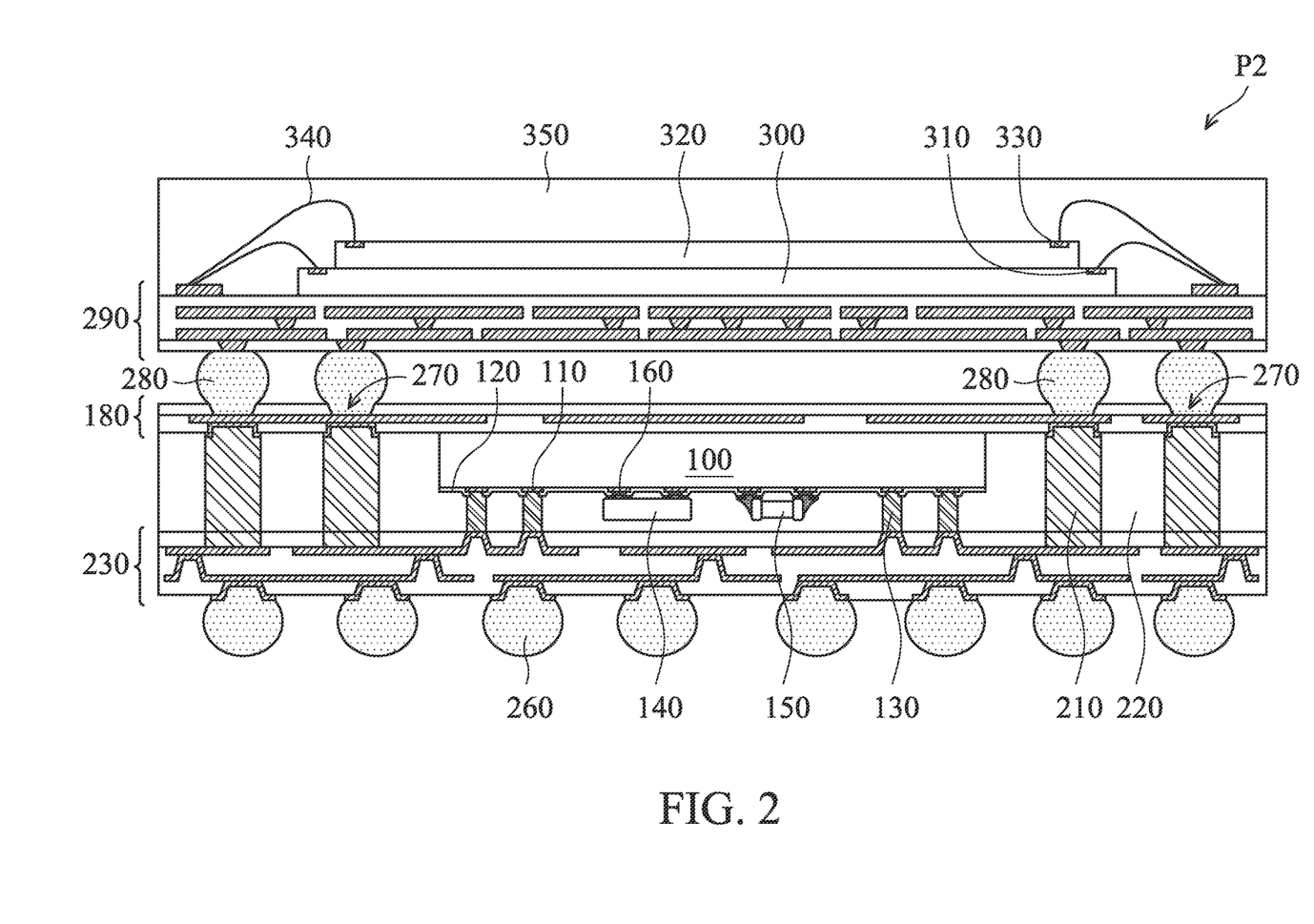
FIG. 2 is a cross-sectional view of a package-on-package (POP) semiconductor package assembly, in accordance with some embodiments of the disclosure.

Various semiconductor packages can be stacked on the semiconductor package show in FIG. 1D to form a semiconductor package assembly. FIG. 2 is a cross-sectional view of a package-on-package (POP) semiconductor package assembly, in accordance with some embodiments of the disclosure. Elements in FIG. 2 that are the same as those in FIGS. 1A-1D are labeled with the same reference numbers as in FIGS. 1A-1D and are not described again for brevity.

As shown in FIG. 2, a semiconductor package assembly P2 includes the semiconductor package show in FIG. 1D and another semiconductor package stacked thereon. It should be noted that the structure of the stacked semiconductor package shown in FIG. 2 are only an example and are not a limitation to the present invention.

The two semiconductor packages are mounted together and are electrically connected to each other through conductive components 280. In some embodiments, the semiconductor die 100 is positioned between the active element 140 and the stacked semiconductor package, and between the passive element 150 and the stacked semiconductor package. The active element 140 and the passive element 150 vertically overlap the semiconductor die 100 and the overlying semiconductor package. In some embodiments, the conductive components 280 are conductive pillars, conductive bumps (such as micro bumps), conductive paste structures, or another suitable conductive component. The conductive components 280 may include copper, solder, or another suitable conductive material. In some other embodiments, the conductive components 280 are surrounded by an underfill material.

As shown in FIG. 2, the overlying semiconductor package comprises a base 290, at least one semiconductor die (such as two vertically stacked semiconductor dies 300 and 320), bonding wires 340 and a molding compound 350. In some embodiments, the base 290 is a PCB and may be formed of PP. The base 290 is electrically connected to the RDL structure 180 through the conductive components 280.

The semiconductor die 300 is attached on the base 290 through an adhesive layer such as glue or another suitable adhesive material. The semiconductor die 300 is electrically connected to the base 290 through its pads 310 and the bonding wires 340. In some embodiments, the semiconductor die 300 is a memory die or another suitable semiconductor die. The semiconductor die 320 is attached on the semiconductor die 300 through an adhesive layer such as glue or another suitable adhesive material. The semiconductor die 320 is electrically connected to the base 290 through its pads 330 and the bonding wires 340. In some embodiments, the semiconductor die 320 is a memory die or another suitable semiconductor die. In some embodiments, the semiconductor dies 300 and 320 are DRAM dies.

In some embodiments, the semiconductor die 300 or 320 and the active element 140 are positioned on two opposite sides of the base 290. The semiconductor die 300 or 320 and the passive element 150 are positioned on two opposite sides of the base 290.

As shown in FIG. 2, the molding compound 350 covers the base 290 and surrounds the semiconductor dies 300 and 320. The bonding wires 340 are embedded in the molding compound 350. In some embodiments, the molding compound 350 is formed of a nonconductive material such as an epoxy, a resin, a moldable polymer, or another suitable molding material. In some embodiments, the molding compound 350 is applied as a substantial liquid, and then is cured through a chemical reaction. In some other embodiments, the molding compound 350 is a UV or thermally cured polymer applied as a gel or malleable solid, and then is cured through a UV or thermal curing process. The molding compound 350 may be cured with a mold.

Figure 3:
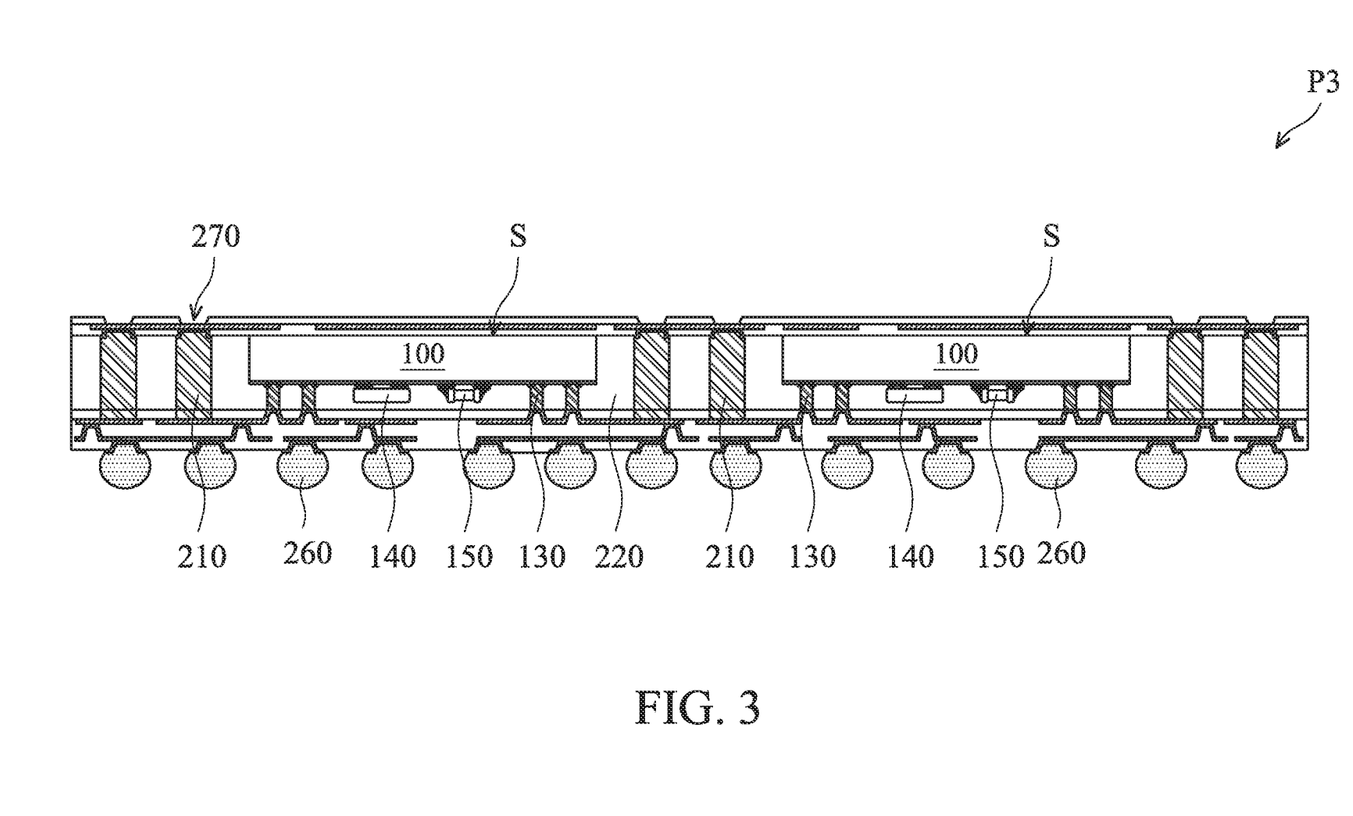
FIG. 3 is a cross-sectional view of a semiconductor package assembly, in accordance with some embodiments of the disclosure.
Figure 4:
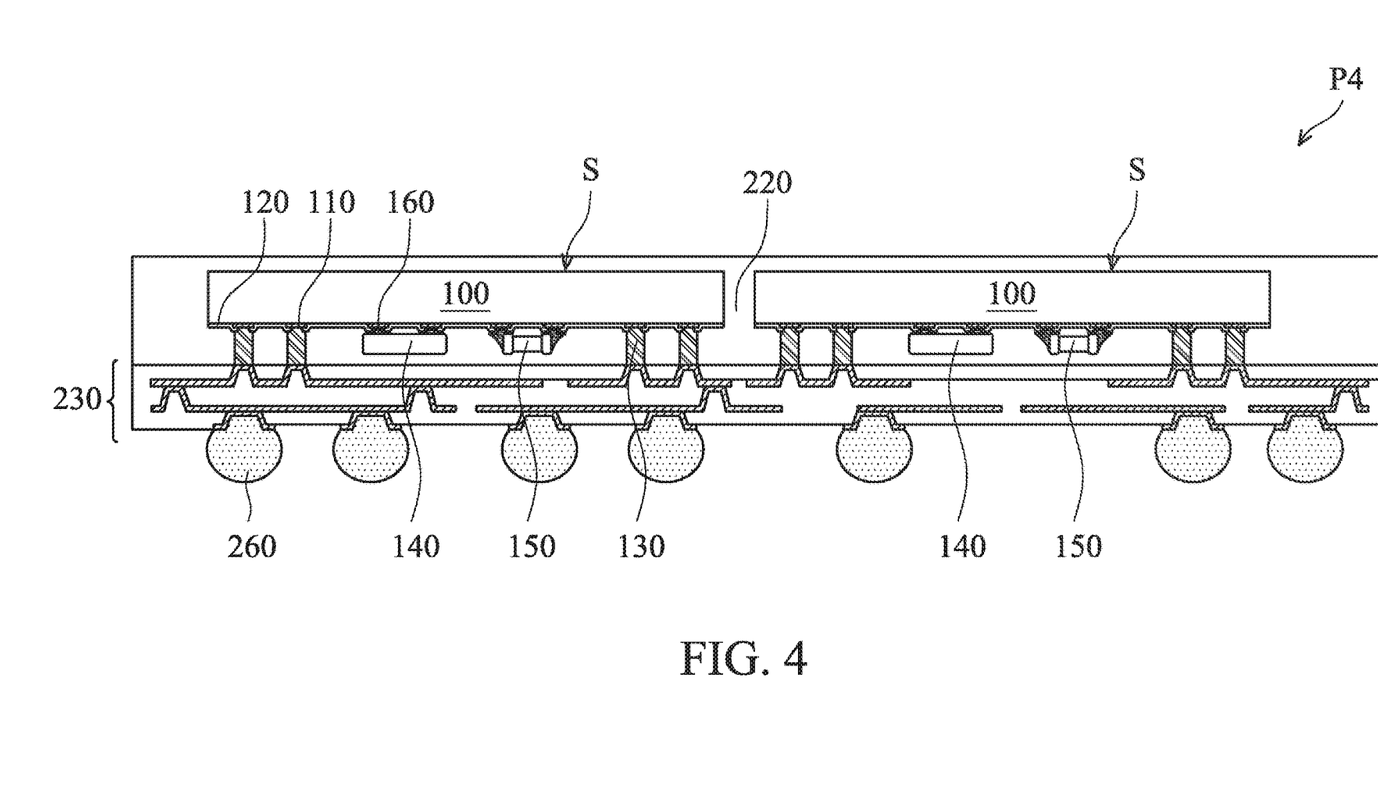
FIG. 4 is a cross-sectional view of a semiconductor package assembly, in accordance with some embodiments of the disclosure.

Many variations and/or modifications can be made to embodiments of the disclosure. FIGS. 3 and 4 are cross-sectional views of a semiconductor package assembly, in accordance with some embodiments of the disclosure. Elements in FIGS. 3 and 4 that are the same as those in FIGS. 1A-1D are labeled with the same reference numbers as in FIGS. 1A-1D and are not described again for brevity.

Referring to FIG. 3, a semiconductor package assembly P3 is shown. The semiconductor package assembly P3 is similar to the semiconductor package assembly P1 shown in FIG. 1D. The main difference between the semiconductor package assemblies P1 and P3 is that the semiconductor package assembly P1 includes one subpackage S while the semiconductor package assembly P3 includes two subpackages S. In some embodiments, the two semiconductor dies 100 are positioned side by side. The semiconductor package assembly P3 may include more than two subpackages S.

In some embodiments, there are vias 210 positioned between the two subpackages S. In some embodiments, the vias 210 and the two semiconductor dies 100 are positioned side by side. In some embodiments, the vias 210 are positioned in a peripheral region of one or both of the semiconductor dies 100. In some other embodiments, there is no via 210 positioned between the two subpackages S. A portion of the molding compound 220 is sandwiched between the two semiconductor dies 100.

Referring to FIG. 4, a semiconductor package assembly P4 is shown. The semiconductor package assembly P4 is similar to the semiconductor package assembly P1 shown in FIG. 1D. The main difference between the semiconductor package assemblies P1 and P4 is that the semiconductor package assembly P4 does not include the RDL structure 180 and the vias 210 shown in FIG. 1D. Also, the semiconductor package assembly P1 includes one subpackage S while the semiconductor package assembly P4 includes two subpackages S. In some embodiments, the two semiconductor dies 100 are positioned side by side. In some other embodiments, the semiconductor package assembly P4 includes one subpackage S or more than two subpackages S.

In some embodiments, a portion of the molding compound 220 is sandwiched between the two semiconductor dies 100. In some embodiments, the molding compound 220 further extends on the back surfaces of the semiconductor dies 100 and covers the semiconductor dies 100.

The semiconductor package assembly and methods for forming the same in accordance with some embodiments of the disclosure provide various advantages. The semiconductor package assembly includes one or more active or passive element directly vertically stacked on the semiconductor die. Therefore, the size of the semiconductor package assembly is significantly reduced. Moreover, the semiconductor package assembly has a better SI/PI performance as a result of shorter trace loops. In addition, embodiments of the disclosure also provide the semiconductor package assembly with improved manufacturing yield and more I/O connections. Embodiments of the disclosure further provide the semiconductor package assembly with enhanced integration flexibility, such as device insertion and thermal solution.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising: a first semiconductor package, comprising:
   a first semiconductor die;
   a first redistribution layer (RDL) structure disposed on the first semiconductor die and electrically connected to the first semiconductor die;
   a passive element and an active element disposed between the first semiconductor die and the first RDL structure, wherein the passive element comprises a first surface connected to one or more pads on a surface of the first semiconductor die, and a second surface facing the first RDL structure, and wherein the active element is connected to one or more pads on the surface of the first semiconductor die;
   a molding compound surrounding the first semiconductor die and the passive element, wherein a portion of the molding compound is disposed between the first RDL structure and the passive element and wherein the molding compound separates the first RDL structure and the second surface along an entire width of the second surface; and
   a second redistribution layer (RDL) structure, wherein the first semiconductor die is attached to the second RDL structure through an adhesive layer.

2. The semiconductor package assembly as claimed in claim 1, wherein the first RDL structure is electrically connected to the first semiconductor die through a first via, and wherein the first via is disposed between the first semiconductor die and the first RDL structure and is surrounded by the molding compound.

3. The semiconductor package assembly as claimed in claim 1, wherein the first semiconductor die is positioned between the passive element and the second RDL structure.

4. The semiconductor package assembly as claimed in claim 3, wherein the molding compound covers the second RDL structure.

5. The semiconductor package assembly as claimed in claim 3, wherein the second RDL structure is electrically connected to the first RDL structure through a second via, and wherein the second via is surrounded by the molding compound.

6. The semiconductor package assembly as claimed in claim 5,
   wherein the second via is positioned in a peripheral region of the first semiconductor die.

7. The semiconductor package assembly as claimed in claim 1, wherein the first semiconductor package further comprises a conductive component coupled to the first RDL structure, wherein the conductive component and the passive element are positioned on two opposite sides of the first RDL structure.

8. The semiconductor package assembly as claimed in claim 1, further comprising a second semiconductor package stacked on the first semiconductor package, wherein the first semiconductor die is positioned between the passive element and the second semiconductor package.

9. The semiconductor package assembly as claimed in claim 8,
   wherein the second semiconductor package is a memory package.

10. The semiconductor package assembly as claimed in claim 1, wherein the first semiconductor package further comprises a second semiconductor die surrounded by the molding compound, and the first semiconductor die and the second semiconductor die are positioned side by side.

11. The semiconductor package assembly as claimed in claim 10, wherein the first semiconductor package further comprises another passive element surrounded by the molding compound and disposed between the second semiconductor die and the first RDL structure.

12. The semiconductor package assembly as claimed in claim 10, wherein the first semiconductor package further comprises a via surrounded by the molding compound, and wherein the via, the first semiconductor die and the second semiconductor die are positioned side by side.

13. The semiconductor package assembly as claimed in claim 12, wherein the via is disposed between the first semiconductor die and the second semiconductor die.

14. A semiconductor package assembly, comprising:
   a first semiconductor package, comprising:
   a first semiconductor die;
   a first redistribution layer (RDL) structure disposed on the first semiconductor die and electrically connected to the first semiconductor die; and
   a passive element and an active element disposed between the first semiconductor die and the first RDL structure, wherein the passive element comprises a first surface connected to one or more pads of the first semiconductor die, and a second surface facing the first RDL structure, wherein the active element is connected to one or more pads on the surface of the first semiconductor die, and wherein the first semiconductor die and the first RDL structure are separated by no more than 60 µm;
a molding compound disposed between the first RDL structure and the passive element, wherein the molding compound separates the first RDL and the second surface along an entire width of the second surface;
a second redistribution layer (RDL) structure, wherein the first semiconductor die is attached to the second RDL structure through an adhesive layer; and
a second semiconductor package stacked on the first semiconductor package, wherein the first semiconductor die is positioned between the passive element and the second semiconductor package.

15. The semiconductor package assembly as claimed in claim 14, wherein the second semiconductor package comprises a second semiconductor die disposed on a base, and the second semiconductor die and the passive element are positioned on two opposite sides of the base.

16. The semiconductor package assembly as claimed in claim 15, wherein the active element and the passive element vertically overlap the first semiconductor die and the second semiconductor die.

17. The semiconductor package assembly as claimed in claim 15, wherein the first semiconductor package further comprises:
a molding compound surrounding the first semiconductor die and the passive element; and
a first via surrounded by the molding compound, wherein the first semiconductor die is positioned between the first via and the second semiconductor package.

18. The semiconductor package assembly as claimed in claim 17, wherein the first semiconductor package further comprises a second via surrounded by the molding compound and positioned between the first RDL structure and the second semiconductor package.

19. The semiconductor package assembly as claimed in claim 18, wherein a size of the second via is greater than that of the first via.

20. A method for forming a semiconductor package assembly, comprising:
forming a first semiconductor package, wherein the formation of the first semiconductor package comprises:
providing a passive element and an active element on a first semiconductor die, wherein the passive element is electrically and directly connected to one or more pads of the first semiconductor die, and wherein the active element is connected to one or more pads of the first semiconductor die;
forming a molding compound surrounding the first semiconductor die and the passive element;
forming a first redistribution layer (RDL) structure on the first semiconductor die to electrically connect to the first semiconductor die, wherein the passive element is positioned between the first semiconductor die and the first RDL structure, wherein the passive element comprises a surface facing the RDL, and wherein a portion of the molding compound is disposed between the RDL structure and the passive element and wherein the molding compound separates the RDL and the surface of the passive element along an entire width of the surface, wherein the first semiconductor die and the RDL structure are separated by no more than 60 µm;
forming a second redistribution layer (RDL) structure; and
attaching the first semiconductor die to the second RDL structure through an adhesive layer.

21. The method as claimed in claim 20, further comprising forming a first via on the first semiconductor die before providing the passive element, wherein the first RDL structure is electrically connected to the first semiconductor die through the first via.

22. The method as claimed in claim 21, wherein the molding compound surrounds the first via without covering a top surface of the first via.

23. The method as claimed in claim 21, further comprising bonding the first semiconductor die with the passive element and the first via thereon to a carrier substrate before the formation of the molding compound.

24. The method as claimed in claim 23, further comprising:
debonding the carrier substrate after the formation of the first RDL structure; and dicing the first RDL structure, the second RDL structure and the molding compound to form the first semiconductor package.

25. The method as claimed in claim 23, further comprising forming a second via on the carrier substrate before bonding the first semiconductor die, wherein the second via and the first semiconductor die are positioned side by side.

26. The method as claimed in claim 25, wherein the molding compound surrounds the second via without covering a top surface of the second via.

27. The method as claimed in claim 25, further comprising forming the second redistribution layer (RDL) structure on the carrier substrate before the formation of the second via, wherein the second RDL structure is positioned between the first semiconductor die and the carrier substrate.

28. The method as claimed in claim 27, further comprising:
debonding the carrier substrate to expose the second RDL structure after the formation of the first RDL structure; and
stacking a second semiconductor package on the first semiconductor package, wherein the first semiconductor die is positioned between the passive element and the second semiconductor package.

29. The method as claimed in claim 28, further comprising:
forming an opening in the second RDL structure after debonding the carrier substrate; and forming a conductive component in the opening to electrically connect the first semiconductor package and the second semiconductor package.

* * * * *